United States Patent [19]
Cornwell et al.

[11] 3,868,594
[45] Feb. 25, 1975

[54] STRIPLINE SOLID STATE MICROWAVE OSCILLATOR WITH HALF WAVELENGTH CAPACITIVE RESONATOR

[75] Inventors: Gerald M. Cornwell; William M. Streeton, Jr., both of Marlboro, Mass.

[73] Assignee: Raytheon Company, Lexington, Mass.

[22] Filed: Jan. 7, 1974

[21] Appl. No.: 431,467

[52] U.S. Cl. .......... 331/99, 331/107 R, 331/107 G, 333/84 M
[51] Int. Cl. .......... H03b 7/14
[58] Field of Search .......... 331/96, 99, 107 R, 107 G; 333/84 M

[56] References Cited

UNITED STATES PATENTS

| | | | |
|---|---|---|---|
| 3,680,002 | 7/1972 | Quine | 331/99 X |
| 3,721,919 | 3/1973 | Grace | 331/96 |
| 3,753,153 | 8/1973 | Liu et al. | 331/107 R |

*Primary Examiner*—Siegfried H. Grimm
*Attorney, Agent, or Firm*—Edgar O. Rost; H. A. Murphy; Joseph D. Pannone

[57] ABSTRACT

A microwave oscillator circuit is disclosed utilizing hybrid integrated circuit components deposited as a conducting film strip on an insulating substrate coupled to semiconductor device means, such as bulk effect Gunn or avalanche transit time negative resistance diodes. A high Q resonator is provided in the microstrip transmission line circuit coupled to the oscillator diode by means of an in-line capacitor approximately one-half wavelength long at the operating frequency of a material such as titanium dioxide. The resonator-capacitor in this circuit arrangement provides a series open circuit to the oscillator diode. In an exemplary embodiment frequency modulation noise was substantially reduced by an order of magnitude and moderate power output levels were achieved in the intermediate microwave frequency band of 6–10 GHz.

7 Claims, 2 Drawing Figures

STRIPLINE SOLID STATE MICROWAVE OSCILLATOR WITH HALF WAVELENGTH CAPACITIVE RESONATOR

BACKGROUND OF THE INVENTION

1. Field of the Invention

The invention relates to microwave integrated circuits including semiconductor oscillator diodes.

2. Description of the Prior Art

Hybrid microwave integrated circuit techniques typically involve diffused monolithic thin film and discrete active and passive elements. Such circuits include insulating substrates having a conductive ground plane on one side and a thin film strip transmission line on the other side. The circuit geometry is provided by such means as photolithographic methods. Such circuits are now utilized for such electronic devices as switches, amplifiers, oscillators, attenuators, phase shifters, limiters and amplitude modulators for operation at microwave frequencies. An example of a microwave integrated circuit disclosed in the prior art is shown in U.S. Pat. No. 3,768,050, issued Oct. 23, 1973 to C. Stiles, Jr. wherein an unpackaged semiconductor PIN diode chip is mounted on the insulating substrate in shunt across a microstrip transmission line circuit formed by a thin conducting film deposited with masking materials and using the conventional photolithographic methods.

In order to provide a low noise stable oscillator utilizing microwave integrated circuit techniques the necessity for the provision of a high Q resonator structure arises. With the use of Gunn diodes it is simple to mount the diode in a hollow waveguide cavity resonator structure, however, heat dissipation, as well as temperature operating limitations, and matching of the impedances of a large number of such Gunn devices are limiting factors. An example of prior art microwave oscillators utilizing avalanche or bulk effect diodes together with microwave integrated circuit techniques may be found in U.S. Pat. No. 3,753,153, issued Aug. 14, 1973 to Liu, et al. In this disclosure a low pass filter is provided utilizing microstrip techniques and the device is operated by means of a double pulse direct current bias signal to trigger an anomalous mode of diode operation. A further example of prior art microwave oscillators is found in U.S. Pat. No. 3,668,553, issued June 6, 1972 to V. Dunn, et al., wherein digital tuning is provided of a microwave stripline oscillator utilizing a Gunn diode and a microstrip resonator of one quarter wavelength deposited on a substrate. In this embodiment a capacitor is utilized for blocking the D.C. bias voltage on the diode from the load. Further, shunt capacitors are disclosed for tuning the resonator with such capacitors disposed in the form of beam leads at a point near the microwave voltage maximum of the stripline resonator. In other prior art teachings, particularly U.S. Pat. No. 3,721,919, issued Mar. 20, 1973 to Grace the improvement is suggested of providing an insert within the substrate in the form of a diamond or beryllium oxide in close proximity to the diode oscillator to provide a greater heat transfer to enhance the power handling capability of the microstrip oscillator. THe insert serves as an adjunct to the heat sink capabilities of the conventional ground plane utilized in microwave integrated circuits.

The generation of high frequency electromagnetic energy at microwave frequencies utilizing bulk effect or avalanche transit time type semiconductor devices has been known since the late 1950's when such inventors as Gunn and Read succeeded in demonstrating interesting negative resistance characteristics when current is passed in certain III-V semiconductor materials and these materials have become important solid state energy sources. The term "bulk effect" is defined as those materials having an active region of bulk semiconductor material which operate without a PN junction in the domain or LSA modes. The Gunn diode is an example of a bulk effect semiconductor device. The term "avalanche" refers to diodes having PN, PIN or Schottky junctions which operate in two basic modes. The impact avalanche transit time mode generates CW power as a function of external circuitry and the device is referred to as an IMPATT avalanche diode. The trapped plasma avalanche trigger transit or high efficiency mode operates with the second frequency harmonic trapped in the cavity which does not propagate and such device is referred to as a TRAPATT avalanche diode. The state of the art with relation to both of these diode devices has now achieved relatively moderate power output levels of several watts per device and efficiencies approaching 40–50%. The high electric fields and avalanche currents, however, create a thermal energy dissipation problem due to the fact that the high current densities with $I^2R$ losses limit the overall power generation of these solid state devices. With these higher efficiencies of these sources, it is now possible to generate output powers either CW or pulsed comparable to vacuum-type microwave devices with the added advantage of incorporating microwave integrated circuit techniques for simplified packaging and lower cost. The problems of thermal energy dissipation and improvement in stability of oscillations with lower noise figures, however, can still be improved to make such solid state energy sources more widely utilized.

SUMMARY OF THE INVENTION

In accordance with the teachings of the invention a solid state oscillator circuit is provided utilizing microwave integrated circuit techniques. A gallium arsenide avalanche type diode is coupled to a microstrip transmission line comprising a conductive film deposited on an insulating substrate having a conductive ground plane bonded to the opposite planar surface. The microstrip transmission line includes D.C. bias means, as well as quarter wave short circuiting stubs for isolation of the D.C. bias input from the high frequency electromagnetic energy generated by the oscillator diode. Additionally, a directional coupler having a mean coupling value of, illustratively, 15 db is utilized for capacitively coupling the generated energy to subsequent circuits or lumped components such as balanced mixers or receivers. The invention provides for a high Q resonator in the microstrip transmission line by means of a capacitor fabricated of a metallic oxide material, such as titanium dioxide one-half of a wavelength long. The in-line capacitor means appears as a series open circuit at the resonant frequency and the length of the microstrip transmission line transforms this high impedance to the impedance required to develop stable oscillations from the oscillator diode. In an exemplary embodiment having a resonant frequency of 9.375 GHz the solid state oscillator utilizing the one-half wavelength titanium dioxide capacitor demonstrated stable oscillations and substantially an order of magnitude improvement in frequency modulation noise over prior art embodiments.

BRIEF DESCRIPTION OF THE DRAWINGS mean circuits

Details of an illustrative embodiment of the invention will now be described with reference to the accompanying drawings, wherein:

FIG. 1 is a perspective view, partially broken away, of the illustrative solid state microwave oscillator of the invention; and FIG. 2 is a schematic diagram of the circuit of the invention.

DESCRIPTION OF THE PREFERRED EMBODIMENT

Figure 1:
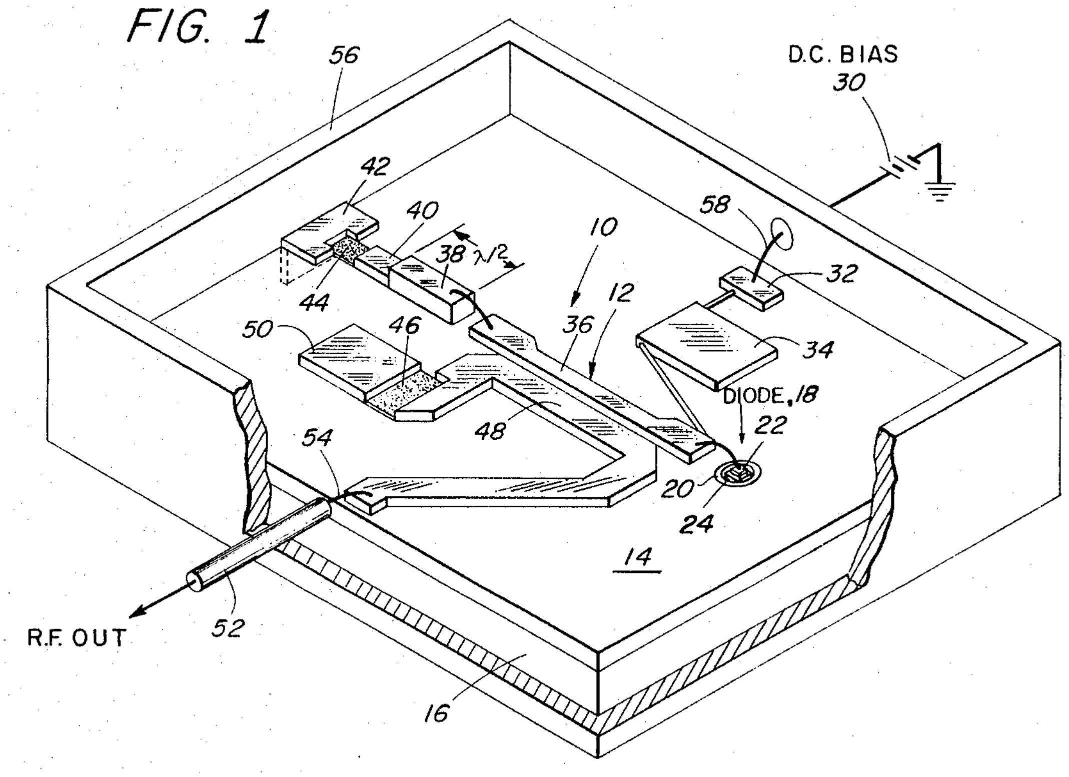

In FIG. 1 the solid state microwave oscillator 10 embodying the circuit of the invention is shown comprising a microstrip transmission line 12 formed in accordance with printed circuit techniques on an insulating substrate 14 bonded to a conductive ground plane 16 which also serves as a heat sink means. The insulating substrate 14 may be formed of a material such as alumina or any other ceramic material and the conductive ground plane 16 may be formed by any known metal plating methods. Microstrip transmission line 12 is formed in the conventional manner by the deposition of a conducting film strip on one side of an insulating substrate. In an exemplary embodiment this circuit component comprised a relatively thin film layer of a metal such as chromium followed by a relatively thick layer of silver or gold utilizing the photolithographic techniques in accordance with integrated circuit techniques.

The oscillator diode 18 comprises either a Gunn bulk effect device or an IMPATT avalanche device of the Read type having PNIN, PIN or PN junctions. In an exemplary embodiment having a resonant frequency of 9.375 GHz an IMPATT avalanche diode was utilized. The diode is mounted in a hole 20 in substrate 14 and comprises a chip 22 of, for example, epitaxially grown gallium arsenide mounted on an appropriate heat sink plug 24. The plug extends through the substrate to contact ground plane 16.

The D.C. bias for the diode 18 is provided by external source 30 connected to a distributed network having high frequency electromagnetic energy isolation means. Such a network includes strip 32 conductively coupled to a quarter wave low impedance stub 34 which is in turn coupled to the main transmission line section, and by means of a lead to the diode. The diode is typically operated in a reversebiased condition. The quarter wave short circuit stub 34 is conductively coupled by a quarter wave high impedance line to one end of the main section 36 of microstrip transmission line 12. As a result there is an open circuit at the point where the D.C. bias lead is connected to the oscillator diode 18 to result in an effective D.C. bias input isolation.

Main transmission line section 36 is coupled to the oscillator diode 18 and extends a length and a width which is determined in accordance with well-known impedance matching practice in the microwave integrated circuit art. In line with the main section 36 and oscillator diode, a high Q resonator 38 is provided having a length of approximately one-half a wavelength at the resonant frequency. This resonator structure appears as a series open circuit at the resonant frequency and together with the length of the main section 36 this high impedance is transformed to the impedance required to develop the stable oscillations from the oscillator diode 18. High Q resonator 38 comprises a capacitor fabricated of a suitable metallic oxide, such as titanium dioxide. THe one-half wavelength capacitor is coupled between strip 40 deposited on the substrate 14 and the end of main line section 36. The microstrip transmission line is connected to ground by means of strip conductor 42 and a 50-ohm resistor 44 to the ground plane. The resistor having the desired value may be formed by removal of the gold conducting film strip to expose the underlying chrome metalization on substrate 14.

The high frequency oscillations are capacitively coupled to a directional coupler 48 having, illustratively, a mean coupling of 15 db also formed by integrated circuit techniques on the substrate 14. One end of the directional coupler is provided with a resistor 46 together with a quarter-wave stub 50 to provide a short circuit and prevent any coupling of energy from this end. The opposing end of the directional coupler is provided with R.F. output means including a coaxial line 52 having a center conductor 54. The generated energy may be coupled to a load or utilized with additional circuits provided in accordance with microwave integrated circuit techniques, such as an integrated receiver in a solid state radar system.

The solid state microwave oscillator may be enclosed in a conductive enclosure having conductive walls 56 to thereby shield the solid state oscillator circuit and prevent stray radiation. Further, the enclosure serves as an additional heat sink means for the oscillator diode. The D.C. bias lead 58 and coaxial output line 52 extend through the conductive walls 56 and are insulated by feedthrough means in the manner well-known in the art. In this view the top wall of the conductive enclosure 56 has been removed to disclose internal structure.

Figure 2:
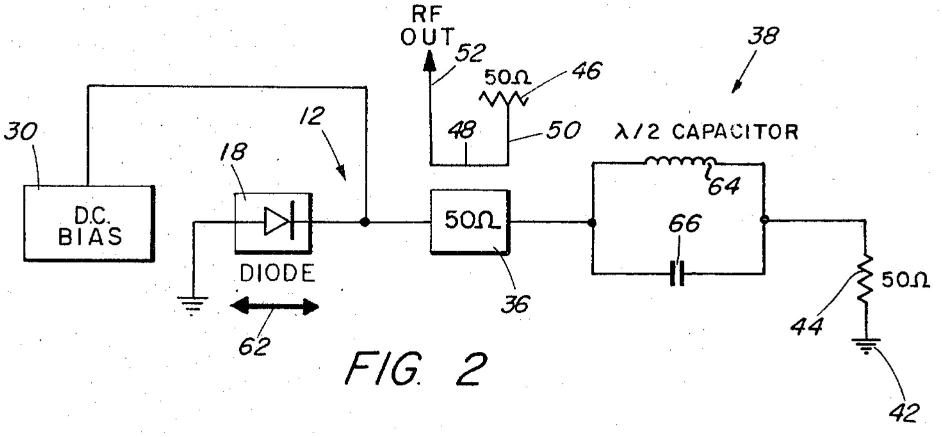

Referring next to FIG. 2 a schematic diagram of the oscillator circuit is shown. D.C. bias 30 which may be either in the forward or reverse direction, as indicated by the arrow 62, is operatively associated with the oscillator diode 18, shown conductively coupled to the main section 36 of the microwave strip transmission line 12 having an impedance value of illustratively 50 ohms. In-line high Q resonator 38 comprising the one-half wavelength titanium dioxide capacitor provides the inductive and capacitive components 64 and 66, respectively. Grounded termination 42 and resistor 44 are connected to the resonator 38. Directional coupler 48 is indicated as being capacitively coupled to main section 36 with one end terminating in R.F. output line 52. The opposing end is connected to short circuit stub section 50 and resistor 46. Both resistors 44 and 46 have a 50-ohm value.

There is thus disclosed a microwave oscillator circuit of relatively high power capabilities utilizing avalanche or bulk-effect semiconductor devices. In the exemplary embodiment, the stability of generated oscillations was markedly improved and a substantial reduction of frequency modulation noise was noted in terms of an order of magnitude with the one-half wavelength high Q resonator structure provided by the titanium dioxide capacitor. Numerous substitutions and modifications may be readily provided by those skilled in the art. The foregoing description of an embodiment of the invention should, therefore, be interpreted broadly and not in a limiting sense.

We claim:

1. A microwave integrated oscillator circuit comprising:

an insulating substrate;

a conductive ground plane contacting one surface of said substrate;

a microwave transmission line formed by a conducting strip bonded to the opposite surface of said substrate;

semiconductor means for generating microwave frequency energy conductively coupled to said transmission line;

resonator means to provide a substantially high impedance at a predetermined resonant frequency conductively coupled in series with said transmission line;

said resonator means comprising capacitor means having a length substantially one-half of a wavelength at said resonant frequency; and means for coupling said energy from said line to a load.

2. The circuit according to claim 1 wherein said capacitor means comprises titanium dioxide.

3. The circuit according to claim 1 where said semiconductor means comprise a gallium arsenide IMPATT avalanche oscillator diode.

4. The circuit according to claim 1 wherein said coupling means include a directional coupler formed by a strip conductor bonded to said substrate and capacitively coupled to said transmission line.

5. The circuit according to claim 1 and conductive means for enclosing and shielding said substrate and semiconductor means.

6. The circuit according to claim 1 wherein said substrate comprises a body member of alumina ceramic.

7. The circuit according to claim 1 and means for providing a D.C. bias to said semiconductor means from an external source including a strip conductor, a conducting film stub substantially one-quarter wavelength long at said resonant frequency and a high impedance line conductor coupled to said stub and said transmission line bonded to said substrate.

* * * * *